(12) United States Patent
Huang

(10) Patent No.: US 7,619,259 B2
(45) Date of Patent: Nov. 17, 2009

(54) SEMICONDUCTOR DEVICE INTEGRATED WITH HEAT SINK AND METHOD OF FABRICATING THE SAME

(75) Inventor: Kuo-Hsin Huang, Hsinchu (TW)

(73) Assignee: High Power Optoelectronics, Inc., Taichung County (TW)

( * ) Notice: Subject to any disclaimer, the term of this patent is extended or adjusted under 35 U.S.C. 154(b) by 305 days.

(21) Appl. No.: 11/636,522

(22) Filed: Dec. 11, 2006

(65) Prior Publication Data

US 2007/0131952 A1    Jun. 14, 2007

(30) Foreign Application Priority Data

Dec. 12, 2005    (TW) .............................. 94143879 A

(51) Int. Cl.
*H01L 33/00*    (2006.01)
(52) U.S. Cl. .................. 257/98; 257/706; 257/E33.001; 257/E33.057
(58) Field of Classification Search .................... 257/79, 257/98, 99, 676, 706, E33.001, E33.057
See application file for complete search history.

(56) References Cited

U.S. PATENT DOCUMENTS 7,205,573 B2 *    4/2007    Liu et al. ....................... 257/79

FOREIGN PATENT DOCUMENTS

TW    251388    9/1981

* cited by examiner

*Primary Examiner*—Quoc D Hoang
(74) *Attorney, Agent, or Firm*—Birch, Stewart, Kolasch & Birch, LLP

(57) ABSTRACT

The present invention is to provide a semiconductor device which includes a mounting base and a light-emitting device. The mounting base includes a substrate of a first semiconductor material and a first layer of a material with high thermal conductivity formed over the substrate. Furthermore, the light-emitting device is a multi-layer structure which includes at least a second layer of a second semiconductor material. The light-emitting device is mounted on the first layer of the mounting base. Moreover, the difference of the thermal expansion coefficient between the first semiconductor material and the second semiconductor material is between a predetermined range.

5 Claims, 8 Drawing Sheets

SEMICONDUCTOR DEVICE INTEGRATED WITH HEAT SINK AND METHOD OF FABRICATING THE SAME

BACKGROUND OF THE INVENTION

1. Field of the Invention

The invention relates to a semiconductor device and method of fabricating the same, and more particularly, to a semiconductor device containing a light-emitting device and method of fabricating the same.

2. Description of the Prior Art

Because the advantages of long life span, light, low power consumption, and no mercury added, semiconductor light-emitting device, such as light-emitting diode (LED), has became a ideal lighting source and being developed. LED can be applied in several fields, include such as information, communication, consumer electronics, vehicles, traffic light, billboard and illumination market. The most popular fields includes the communication industry, such as the back light of cellular phones and the light of keys; the vehicle industry, such as the signal lights of cars and the dashboards of cars; and other illumination industries.

In the past, some methods of fabricating the semiconductor light-emitting device, such as the method disclosed in TW Pat. No. 68620, TW Pat. No. 96804, and TW Pat. No. 111466, are to use compound semiconductor, e.g., GaAs, InP, and $Al_2O_3$, to prepare the substrate. After the substrate prepared, to form a n-type or a p-type semiconductor on the substrate by epitaxy technology. However, because the compound semiconductor substrate is capable of absorbing the photon emitted from the light-emitting device, the light emitting efficiency is largely reduced. Moreover, because of the low thermal expansion coefficient of the compound semiconductor substrate, the semiconductor light-emitting device can not be operated under high current, and result in lower output power thereof. Furthermore, life of the semiconductor light-emitting device will easily be reduced because of the accumulation of heat generated by itself.

To overcome the disadvantages described above, many prior arts were disclosed in such as TW Pat. No. 573373, TW Pat. No. 565957, and TW Pat. No. 550834. These prior arts disclosed the method of adding metal material to the substrate of the semiconductor light-emitting device, so as to conduct the heat generated by the semiconductor light-emitting device. Therefore, the metal substrate allowed the semiconductor light-emitting device to be operated in a higher current and output power.

However, the difference of thermal expansion coefficient between conventional metal material, such as Ga, Cu, and Al, for the substrate and the epitaxy material is very large. Therefore, during the processes of fabricating the semiconductor light-emitting device, great stress will be generated between the substrate and the epitaxy, so as to destroy the epitaxy structure.

SUMMARY OF THE INVENTION

Accordingly, the scope of the invention is to provide a semiconductor device containing a light-emitting device and method of fabricating the same. Furthermore, the method can overcome the disadvantages of the prior art as described above.

A semiconductor device according to a preferred embodiment of the present invention includes a mounting base and a light-emitting device. The mounting base includes a substrate of a first semiconductor material, and a first layer of a high thermal conductive material, formed over the substrate.

In addition, the light-emitting is a multi-layer structure which includes at least a second layer of a second semiconductor material. The light-emitting device is mounted to the first layer of the mounting base, and the difference of the thermal expansion coefficient between the first semiconductor material and the second semiconductor material is less than a predetermined range.

The scope of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

The present invention provides a semiconductor device. In addition, preferred embodiments according to the invention are disclosed as follows.

Figure 1:
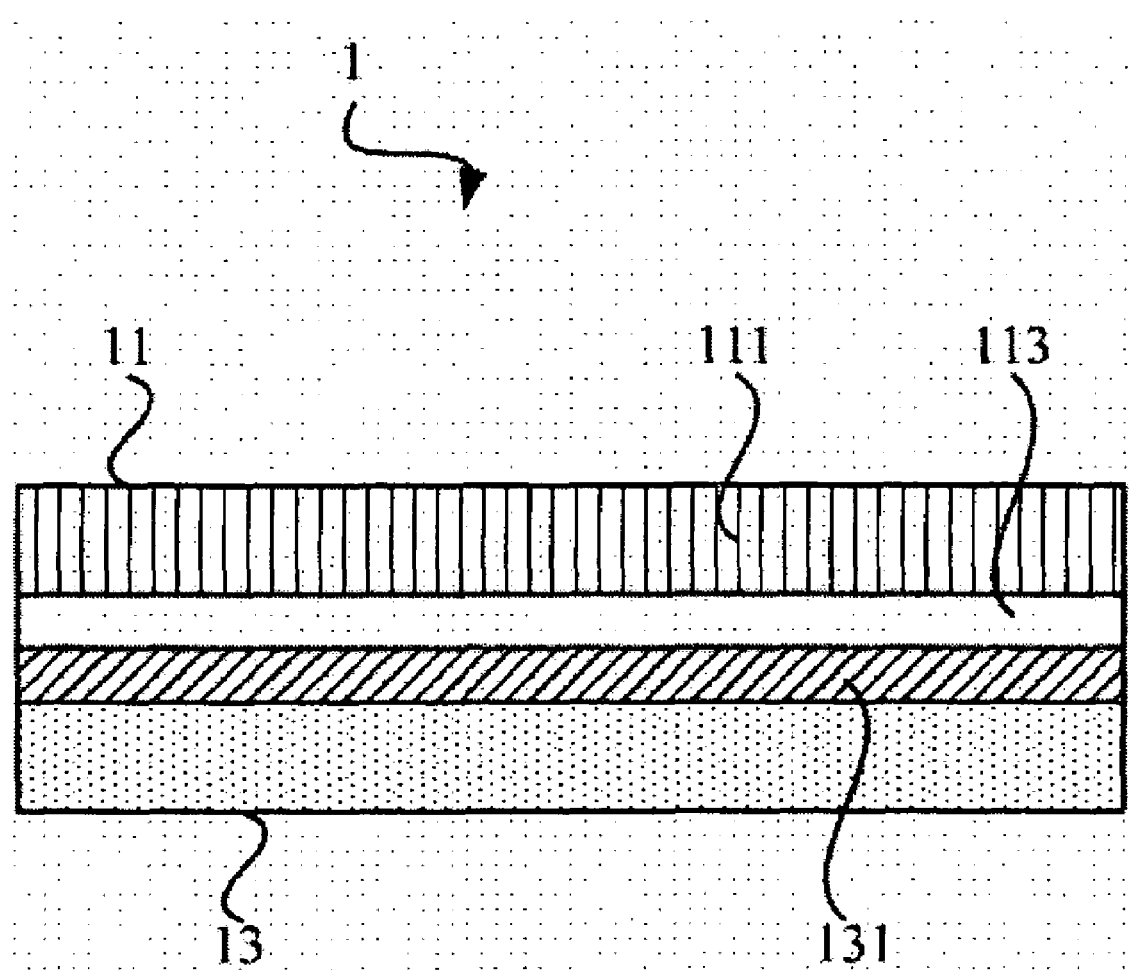
FIG. 1 is a sectional view of a semiconductor device in accordance with an embodiment of the present invention.

Please refer to FIG. 1. FIG. 1 is a sectional view of a semiconductor device 1 in accordance with an embodiment of the present invention. The semiconductor device 1 includes a mounting base 11 and a light-emitting device 13. Furthermore, the mounting base 11 includes a substrate 111 and a first layer 113.

The substrate 111 is formed of a first semiconductor material, such as silicon or silicon carbide (SiC). Moreover, the first layer 113 is formed of a high thermal conductive material, such as gold, silver, copper, aluminum, and diamond, over the substrate 111. In an embodiment, the thickness of the substrate 111 is less than 250 micrometers, and the thickness of the first layer 113 is between 10 and 100 micrometers.

In addition, the light-emitting device 13 is a multi-layer structure, and the multi-layer structure includes at least a second layer 131 of a second semiconductor material. It should be noted that the difference of the thermal expansion coefficient between the first semiconductor material and the second semiconductor material is less than a predetermined range. In addition, the light-emitting device 13 is mounted to the first layer 113 of the mounting base 11. Furthermore, in the embodiment, the light-emitting device 13 is mounted to the first layer 113 of the mounting base by the second layer 131.

In another embodiment of the invention, the multi-layer structure of the light-emitting device further includes a reflecting layer, and the light-emitting is mounted to the first layer of the mounting base by the reflecting layer. In practice, the reflecting layer can be formed by a non-wafer bonding process, such as evaporation, electroplating, or sputtering.

Figure 2A:
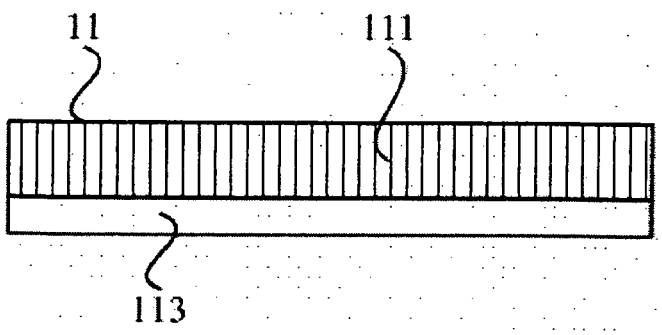
FIG. 2A to 2C show a method of fabricating a semiconductor device according to an embodiment of the invention.
Figure 2B:
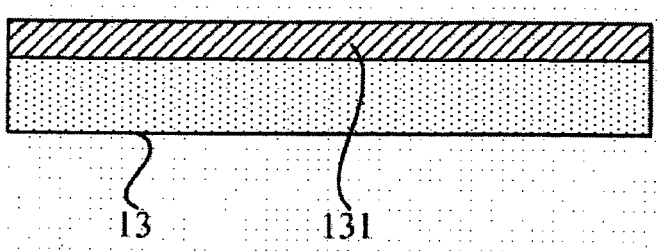
Figure 2C:
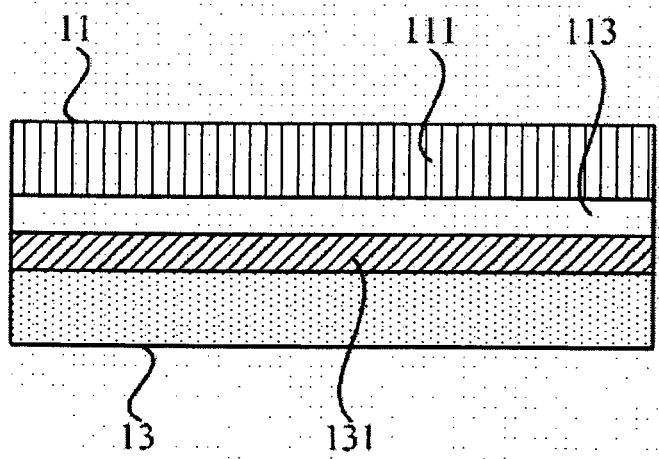

Referring to FIG. 2A to 2C, FIG. 2A to 2C show a method of fabricating a semiconductor device according to an embodiment of the invention. First of all, as shown in FIG. 2A, preparing a mounting base 11, which includes a substrate 111 of a first semiconductor material and a first layer 113 formed over the first substrate 11.

Then, as shown if FIG. 2B, preparing a light-emitting device 13. The light-emitting device 13 is a multi-layer structure which includes a second layer 131 of a second semiconductor material.

Finally, as shown in FIG. 2C, attaching the light-emitting device 13 to the mounting base 11, such that the first layer 113 is in-between the substrate 111 and the second layer 131. It should be noted that the difference of the thermal expansion coefficient between the first semiconductor material and the second semiconductor material is less than a predetermined range.

In the embodiment, the light-emitting device 13 is mounted to the first layer 113 of the mounting base 11 by the second layer 131. In another embodiment, the multi-layer structure of the light-emitting device further comprises a reflecting layer, and the light-emitting device is mounted to the first layer of the mounting base by the reflecting layer. In practice, the reflecting layer can be formed by a non-wafer bonding process, such as evaporation, electroplating, or sputtering.

In practice, the first semiconductor material is silicon or silicon carbide. Moreover, the first layer 113 is formed of copper, aluminum, or diamond. In practice, the thickness of the substrate 111 is less than 250 micrometers, and the thickness of the first layer 113 is between 10 and 100 micrometers.

Figure 3:
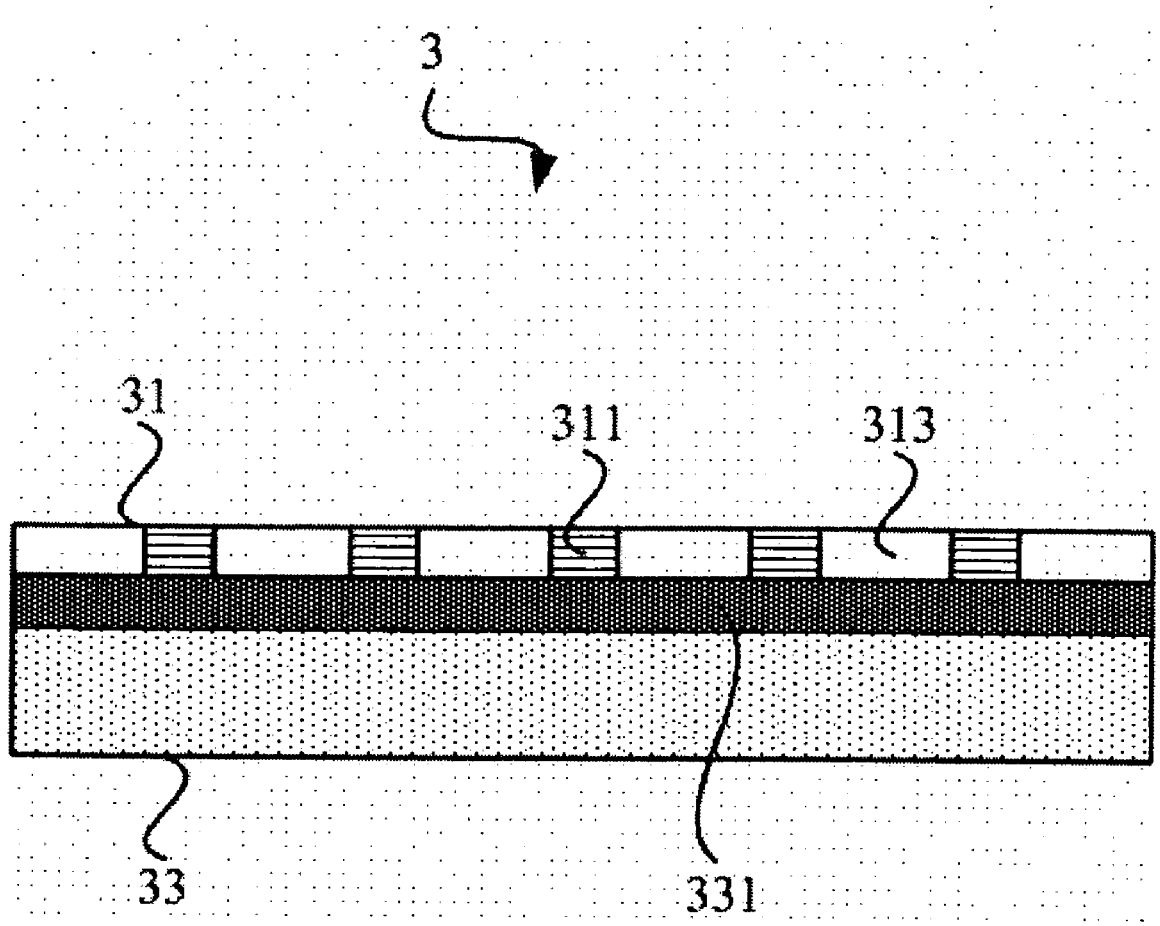
FIG. 3 is a sectional view of a semiconductor device in accordance with an embodiment of the present invention.

Referring to FIG. 3, FIG. 3 is a sectional view of a semiconductor device 3 in accordance with an embodiment of the present invention. The semiconductor device 3 includes a mounting layer 31 and a light-emitting structure 33. The mounting layer 31 further includes a first part 311 of an adhesive material, and a second part 313 of a high thermal conductive material. Please noted that the area ratio of the first part 311 to the second part 313 is less than 0.1. In an embodiment, the thickness of the mounting layer 31 is between 10 and 100 micrometers.

In addition, the light-emitting structure 33 is a multi-layer structure, and the multi-layer structure includes a second layer 331 of a second semiconductor material. The light-emitting structure 33 is mounted to the mounting layer 31 by the second layer 331, and the thermal expansion coefficient of the high thermal conductive material is larger than that of the second semiconductor material. In practice, the high thermal conductive material is gold, silver, copper, aluminum, or diamond.

In another embodiment, the multi-layer structure of the light-emitting device can further include a reflecting layer, and the light-emitting device is mounted to the mounting layer by the reflecting layer. In practice, the reflecting layer can be formed by a non-wafer bonding process, such as evaporation, electroplating, or sputtering.

Figure 4A:
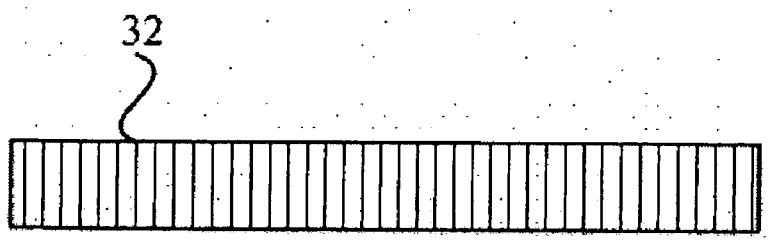
FIG. 4A to 4F show a method of fabricating a semiconductor device according to an embodiment of the invention.
Figure 4B:
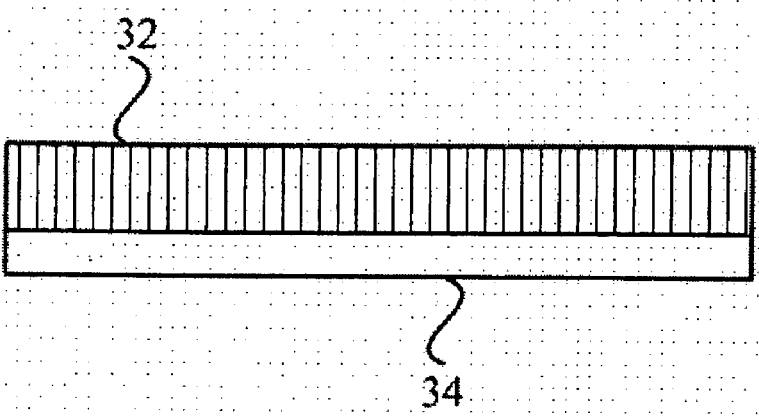

Please refer to FIG. 4A to 4F. FIG. 4A to 4F show a method of fabricating a semiconductor device according to an embodiment of the invention. First of all, as shown in FIG. 4A, preparing a substrate 32 of a first semiconductor material, such as silicon or silicon carbide. Afterward, as shown in FIG. 4B, forming a first layer 34 overlapping the substrate 32. In practice, the first layer 34 is formed of copper, aluminum, or diamond. In practice, the thickness of the substrate 32 is less than 250 micrometers, and the thickness of the first layer 34 is between 10 and 100 micrometers.

Figure 4C:
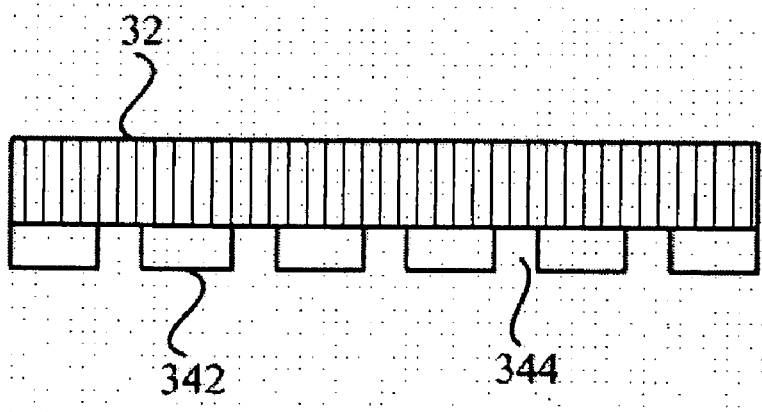

Then, as shown in FIG. 4C, selectively removing the first layer 34 to form a plurality of first blocks 342 and a plurality of zones 344 on the surface of the substrate 32. It should be noted that each of the plurality of zones 344 exists between two of the first blocks 342.

Figure 4D:
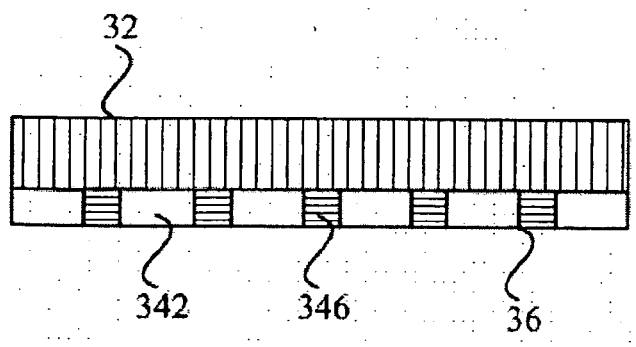

Afterwards, as shown in FIG. 4D, filling an adhesive material into the plurality of zones 344, to form a plurality of second blocks 346, wherein the first blocks 342 together with the second blocks 346 to form a mounting layer 36. In practice, the adhesive material is polyimide or B-staged bisbenzocyclobutene (BCB).

Figure 4E:
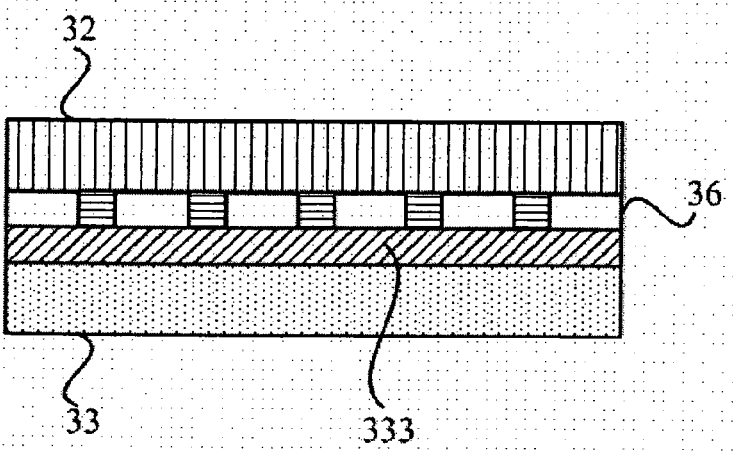
Figure 4F:
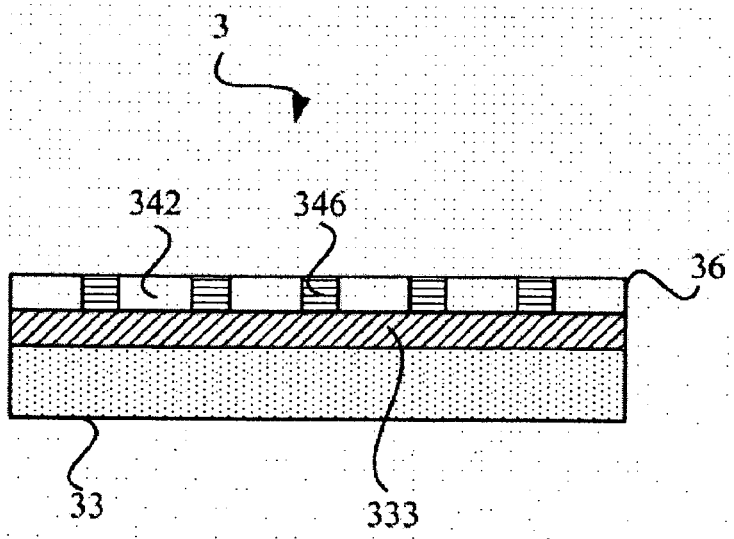

Then, as shown in FIG. 4E, mounting a light-emitting structure 33 to the mounting layer 36. Additionally, the light-emitting structure 33 is a multi-layer structure which includes at least a second layer 333 of a second semiconductor material. In the embodiment, the light-emitting structure 33 is mounted to the mounting layer 36 by the second layer 333. Finally, as shown in FIG. 4F, removing the substrate 32. It should be noted that the difference of the thermal expansion coefficient between the first semiconductor material and the second semiconductor material is less than a predetermined range.

In an embodiment, the method further includes a step of slicing the semiconductor device through the plurality of second blocks. In an embodiment, the multi-layer structure of the light-emitting device further includes a reflecting layer, and the light-emitting device is mounted to the mounting layer by the reflecting layer. In practice, the reflecting layer can be formed by a non-wafer bonding process, such as evaporation, electroplating, or sputtering.

Figure 5A:
FIG. 5A to 5F show a method of fabricating a semiconductor device according to an embodiment of the invention.

Please refer to FIG. 5A to 5F. FIG. 5A to 5F show a method of fabricating a semiconductor device according to an embodiment of the invention. First of all, as shown in FIG. 5A, preparing a substrate 32 of a first semiconductor material, such as silicon or silicon carbide. In practice, the thickness of the substrate 32 is less than 250 micrometers.

Figure 5B:
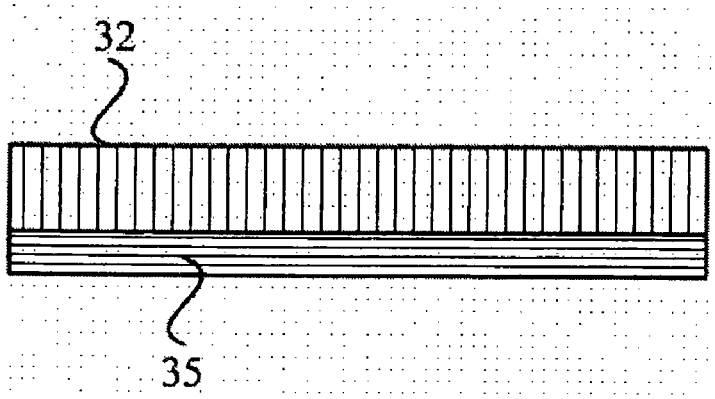

Afterward, as shown in FIG. 5B, forming an adhesive layer 35 overlapping the substrate 32. In practice, the adhesive layer 35 is formed of polyimide or BCB.

Figure 5C:
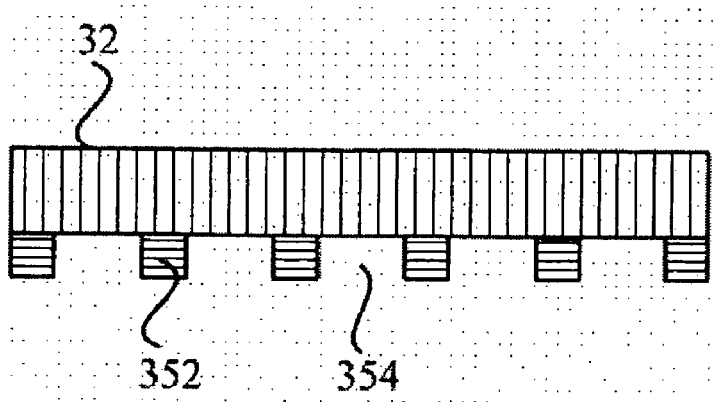

Then, as shown in FIG. 5C, selectively removing the adhesive layer 35 to form a plurality of first blocks 352 and a plurality of zones 354 on the surface of the substrate 32. It should be noted that each of the plurality of zones 354 exists between two of the first blocks 352.

Figure 5D:
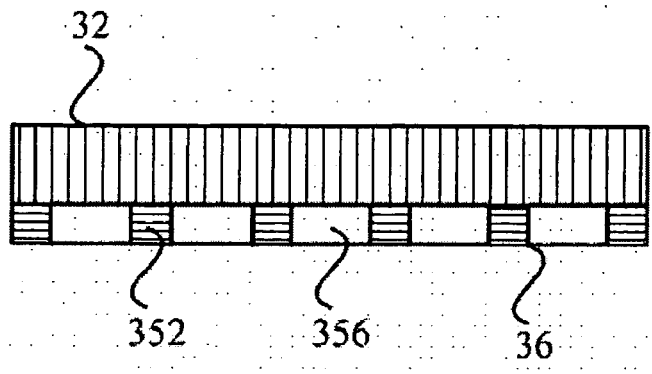

Afterwards, as shown in FIG. 5D, filling a high thermal conductive material into the plurality of zones 354, to form a plurality of second blocks 356 on the surface of the light-emitting device 32. The second blocks 356 together with the first blocks 352 to form a mounting layer 36. In practice, the thickness of the second blocks is between 10 and 100 micrometers. Additionally, in practice, the high thermal conductive material can be gold, silver, copper, aluminum, or diamond.

Figure 5E:
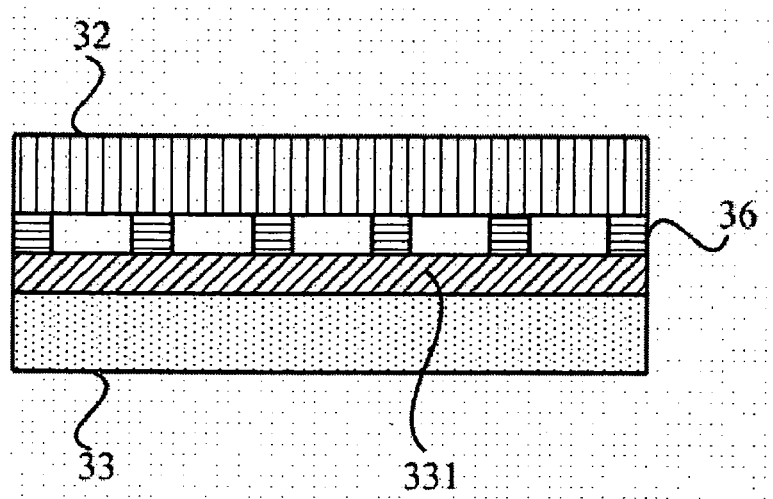
Figure 5F:
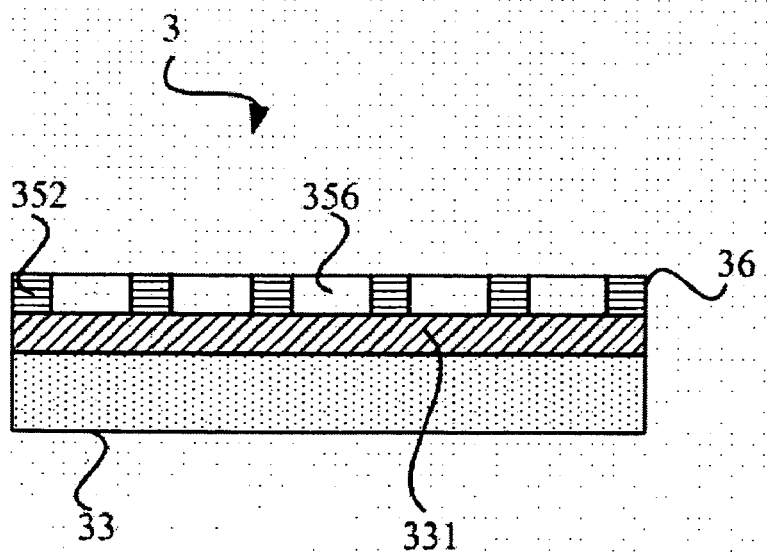

Then, as shown in FIG. 5E, mounting a light-emitting structure 33 above the mounting layer 36. The light-emitting structure 33 is a multi-layer structure which includes a layer 331 of a second semiconductor material. In the embodiment, the light-emitting structure 33 is mounted to the mounting layer 36 by the layer 331. Finally, as shown in FIG. 5F, removing the substrate 32. It should be noted that the difference of the thermal expansion coefficient between the first semiconductor material and the second semiconductor material is less than a predetermined range.

In an embodiment, the method further includes a step of slicing the semiconductor device through the plurality of second blocks. In an embodiment, the multi-layer structure of the light-emitting device further includes a reflecting layer, and the light-emitting device is mounted to the mounting layer by the reflecting layer. In practice, the reflecting layer can be formed by a non-wafer bonding process, such as evaporation, electroplating, or sputtering.

Figure 6A:
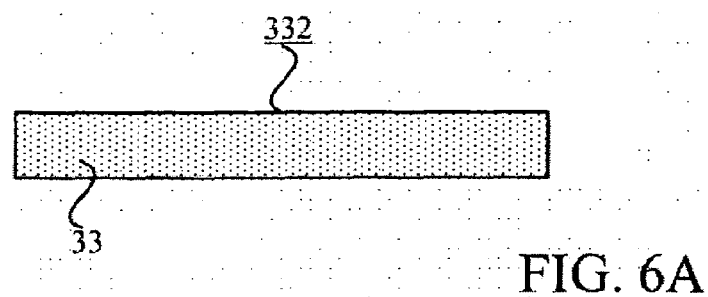
FIG. 6A to 6D show a method of fabricating a semiconductor device according to a preferred embodiment of the invention.

Referring to FIG. 6A to 6D, FIG. 6A to 6D show a method of fabricating a semiconductor device according to a preferred embodiment of the invention. First of all, as shown in FIG. 6A, forming a light-emitting structure 33 which includes a surface 332.

Figure 6B:
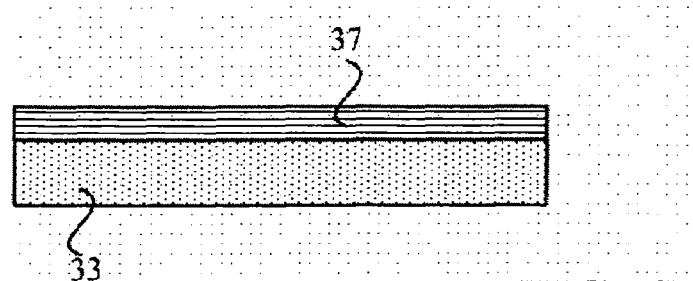

Afterward, as shown in FIG. 6B, forming an adhesive layer 37 overlapping the substrate 32. In practice, the adhesive layer 37 is formed of polyimide or BCB.

Figure 6C:
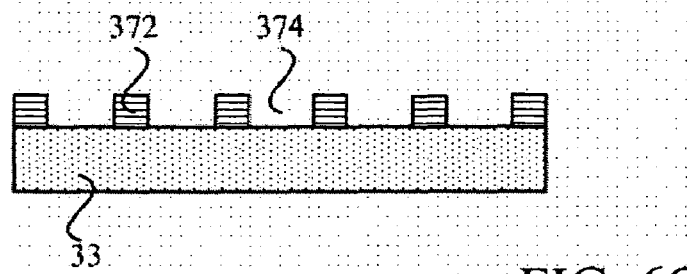

Then, as shown in FIG. 6C, selectively removing the adhesive layer 37, to form a plurality of first blocks 372 and a plurality of zones 374 on the surface 332 of the light-emitting structure 33. It should be noted that each of the plurality of zones 374 exists between two of the first blocks 372.

Figure 6D:
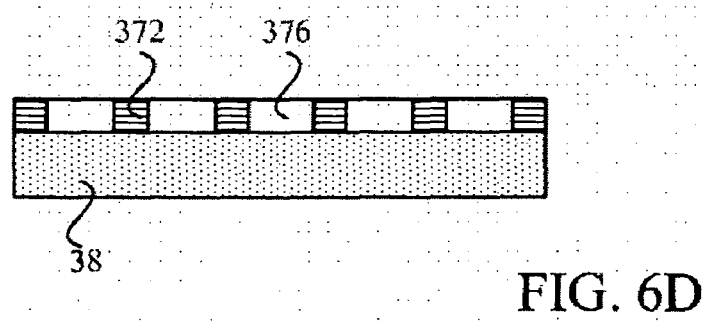

Finally, as shown in FIG. 6D, filling a high thermal conductive material into the plurality of zones 374, to form a plurality of second blocks 376 on the surface 332 of the light-emitting structure 33. In practice, the high thermal conductive material can be gold, silver, copper, aluminum, or diamond. Furthermore, the thickness of the second blocks is between 10 and 100 micrometers.

In an embodiment, the method further includes a step of slicing the semiconductor device through the plurality of first blocks.

Obviously, the semiconductor device of the present invention is a semiconductor device integrated with heat sink. In addition, the method of fabricating the semiconductor device of the present invention is to package the semiconductor device and the heat sink at wafer level, and then to slice the wafer. Comparing with the method to slice the semiconductor device first, then to package the semiconductor device with the heat sink of the prior art, the method disclosed in the invention is more efficient and cost lower. Furthermore, the binding of the semiconductor device and the heat sink of the invention is stronger than the prior art, and it is not easy to fall off under an external force.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and mounteds of the appended claims.

What is claimed is:

1. A semiconductor device comprising:
   a mounting layer comprising a first part of an adhesive material and a second part of a high thermal conductive material, and the area ratio of the first part to the second part being less than 0.1; and
   a light-emitting device, the light-emitting device being a multi-layer structure comprising a second layer of a second semiconductor material;
   wherein the light-emitting device is mounted to the mounting layer, and the thermal expansion coefficient of the high thermal conductive material is larger than that of the second semiconductor material.

2. The semiconductor device of claim 1, wherein the high thermal conductive material is gold, silver, copper, aluminum, or diamond.

3. The semiconductor device of claim 2, wherein the thickness of the mounting layer is between 10 and 100 micrometers.

4. The semiconductor device of claim 3, wherein the light-emitting device is mounted to the mounting layer by the second layer of the second semiconductor material.

5. The semiconductor device of claim 3, wherein the multi-layer structure of the light-emitting device further comprises a reflecting layer, and the light-emitting device being mounted to the mounting layer by the reflecting layer.

* * * * *